(12) United States Patent
Kim et al.

(10) Patent No.: US 9,236,505 B2
(45) Date of Patent: Jan. 12, 2016

(54) SOLAR CELL AND METHOD FOR MANUFACTURING THE SAME

(75) Inventors: Sunyoung Kim, Seoul (KR); Youngho Choe, Seoul (KR)

(73) Assignee: LG ELECTRONICS INC., Seoul (KR)

(*) Notice: Subject to any disclaimer, the term of this patent is extended or adjusted under 35 U.S.C. 154(b) by 741 days.

(21) Appl. No.: 12/878,555

(22) Filed: Sep. 9, 2010

(65) Prior Publication Data

US 2011/0056551 A1  Mar. 10, 2011

(30) Foreign Application Priority Data

Sep. 10, 2009 (KR) .................. 10-2009-0085211

(51) Int. Cl.
| | |
|---|---|
| *H01L 31/042* | (2014.01) |
| *H01L 31/0224* | (2006.01) |
| *H01L 31/068* | (2012.01) |
| *H01L 31/0236* | (2006.01) |
| *H01L 31/05* | (2014.01) |

(52) U.S. Cl.
CPC .... *H01L 31/022441* (2013.01); *H01L 31/0236* (2013.01); *H01L 31/022425* (2013.01); *H01L 31/022458* (2013.01); *H01L 31/0682* (2013.01); *H01L 31/0516* (2013.01); *Y02E 10/50* (2013.01)

(58) Field of Classification Search
CPC ............... H01L 31/022458; H01L 31/02245; H01L 31/0516; H01L 31/0682; H01L 31/022441; H01L 31/0236; H01L 31/022425; Y02E 10/50
USPC ................................................ 136/252, 256
See application file for complete search history.

(56) References Cited

U.S. PATENT DOCUMENTS

| | | | |
|---|---|---|---|
| 7,339,110 B1* | 3/2008 | Mulligan et al. | 136/256 |
| 2006/0014326 A1* | 1/2006 | Auburger et al. | 438/123 |
| 2009/0227061 A1* | 9/2009 | Bateman et al. | 438/57 |
| 2009/0305456 A1 | 12/2009 | Funakoshi | |

(Continued)

FOREIGN PATENT DOCUMENTS

| | | |
|---|---|---|
| JP | 2007-88254 A | 4/2007 |
| JP | 2009-524916 A | 7/2009 |
| KR | 10-2009-0085136 A | 8/2009 |

(Continued)

OTHER PUBLICATIONS

Hermle et al., "Analyzing the effects of front-surface fields on back-junction silicon solar cells using the charge-collection probability and the reciprocity theorem", Journal of Applied Physics, vol. 103, 2008, pp. 054507-1 through 054507-7.

*Primary Examiner* — Devina Pillay
(74) *Attorney, Agent, or Firm* — Birch, Stewart, Kolasch & Birch, LLP (57) ABSTRACT

A solar cell and a method for manufacturing the same are discussed. The solar cell includes a semiconductor substrate, a first doped region of a first conductive type, a second doped region of a second conductive type opposite the first conductive type, a back passivation layer having contact holes exposing a portion of each of the first and second doped regions, a first electrode formed on the first doped region exposed through the contact holes, a second electrode formed on the second doped region exposed through the contact holes, an alignment mark formed at one surface of the semiconductor substrate, and a textured surface that is formed at a light receiving surface of the semiconductor substrate opposite the one surface of the semiconductor substrate in which the first and second doped regions are formed.

7 Claims, 5 Drawing Sheets

(56) References Cited

U.S. PATENT DOCUMENTS

2010/0224251 A1* 9/2010 Funakoshi .................... 136/261
2012/0040490 A1* 2/2012 Gallazzo et al. ................ 438/87

FOREIGN PATENT DOCUMENTS

| KR | 10-2011-0020062 A | | 3/2011 | |
|----|-------------------|---|--------|---|
| WO | WO 2009/011185 A1 | * | 1/2009 | ............ H01L 31/028 |

* cited by examiner

SOLAR CELL AND METHOD FOR MANUFACTURING THE SAME

This application claims priority to and the benefit of Korean Patent Application No. 10-2009-0085211 filed in the Korean Intellectual Property Office on Sep. 10, 2009, the entire contents of which are incorporated herein by reference.

BACKGROUND OF THE INVENTION

1. Field of the Invention

Example embodiments of the invention relate to a solar cell and a method for manufacturing the same.

2. Description of the Related Art

Recently, as existing energy sources such as petroleum and coal are expected to be depleted, interests in renewable energy for replacing the existing energy sources are increasing. As the renewable energy, solar cells for generating electric energy from solar energy have been particularly spotlighted.

A solar cell generally includes a substrate and an emitter layer, which are formed of semiconductors of different conductive types, such as a p-type and an n-type, and electrodes respectively connected to the substrate and the emitter layer. A p-n junction is formed at an interface between the substrate and the emitter layer.

When light is incident on the solar cell having the above-described structure, electrons inside the semiconductors become free electrons (hereinafter referred to as "electrons") by the photoelectric effect. Further, electrons and holes respectively move to the n-type semiconductor (e.g., the emitter layer) and the p-type semiconductor (e.g., the substrate) based on the principle of the p-n junction. The electrons moving to the emitter layer and the holes moving to the substrate are respectively collected by the electrode connected to the emitter layer and the electrode connected to the substrate.

An interdigitated back contact solar cell capable of increasing the size of a light receiving area by forming both an electron electrode and a hole electrode on a back surface of the substrate, i.e., the surface of the substrate on which light is not incident, has been recently developed. Hence, the efficiency of the interdigitated back contact solar cell is improved.

However, as described above, in the interdigitated back contact solar cell, because the p-n junction and each of the electron electrode and the hole electrode have to be formed on the back surface of the substrate, a patterning process is necessary to separately dope p-type impurities and n-type impurities. Thus, an alignment process for aligning each layer is required to manufacture the interdigitated back contact solar cell. As a result, an alignment mark used to align each layer is positioned on the back surface of the substrate.

SUMMARY OF THE INVENTION

In one aspect, there is a solar cell including a semiconductor substrate, a first doped region of a first conductive type formed at one surface of the semiconductor substrate, a second doped region formed at the one surface of the semiconductor substrate at a location adjacent to the first doped region, the second doped region being a second conductive type opposite the first conductive type, a back passivation layer on the semiconductor substrate, the back passivation layer having contact holes exposing a portion of each of the first doped region and the second doped region, a first electrode formed on the first doped region exposed through the contact holes of the back passivation layer, a second electrode formed on the second doped region exposed through the contact hole of the back passivation layer, an alignment mark formed at the one surface of the semiconductor substrate, and a textured surface that is formed at a light receiving surface of the semiconductor substrate opposite the one surface of the semiconductor substrate in which the first and second doped regions are formed.

A surface of the semiconductor substrate at a formation region of the alignment mark has an etched surface that is different from the textured surface in at least one of structure and property. For example, the textured surface has an anisotropically etched surface. However, the surface of the semiconductor substrate at the formation region of the alignment mark has a non-uniformly or isotropically etched surface. Because a first doped layer is formed on the semiconductor substrate of an area to form the alignment mark, and the alignment mark is formed while removing the first doped layer.

A front surface field region into which impurities of the second conductive type are doped may be formed on the textured surface. An anti-reflection layer may be formed on the front surface field region.

In another aspect, there is a method for manufacturing a solar cell including forming a first doped region of a first conductive type and an alignment mark in a semiconductor substrate, forming a second doped region in a region of the semiconductor substrate different from a formation region of the first doped region of the semiconductor substrate, forming a back passivation layer on the semiconductor substrate, the back passivation layer having contact holes exposing a portion of each of the first doped region and the second doped region, and forming a first electrode and a second electrode electrically connected to the first doped region and the second doped region through the contact holes, respectively.

The forming of the first doped region and the alignment mark may include forming a first doped layer of the first conductive type in the semiconductor substrate, forming an insulating layer on the first doped layer, forming a first mask defining a second doped region formation area and an alignment mark formation area on the insulating layer, selectively removing the insulating layer using the first mask to form a second mask having the same pattern as the first mask, removing the first mask, and removing the first doped layer in the second doped region formation area and the alignment mark formation area using the second mask.

As described above, when the first doped layer in the alignment mark formation area is removed, a surface of the semiconductor substrate in the alignment mark formation area is non-uniformly or isotropically etched and a light receiving surface of the semiconductor substrate is isotropically etched to form a textured surface.

The forming of the second doped region may include doping impurities of a second conductive type into the semiconductor substrate in the second doped region formation area and the alignment mark formation area exposed by the second mask and removing the second mask.

The doping of the impurities of the second conductive type may include doping the impurities of the second conductive type into the textured surface to form a front surface field region.

The forming of the back passivation layer may include forming the back passivation layer on the first and second doped regions and the alignment mark, performing an alignment operation using the alignment mark, and forming the contact holes exposing the portion of each of the first doped region and the second doped region.

Before the contact holes are formed, an anti-reflection layer may be formed on the front surface field region.

In another aspect, there is a method for manufacturing a solar cell including forming a first doped layer of a first conductive type in a semiconductor substrate, forming an insulating layer on the first doped layer, forming a first mask defining a second doped region formation area and an alignment mark formation area on the insulating layer, selectively removing the insulating layer using the first mask to form a second mask having the same pattern as the first mask and then removing the first mask, removing the first doped layer in the second doped region formation area and the alignment mark formation area using the second mask and forming a textured surface at a light receiving surface of the semiconductor substrate, doping impurities of a second conductive type into the semiconductor substrate in the second doped region formation area and the alignment mark formation area exposed by the second mask, and into the textured surface, and then removing the second mask, forming a back passivation layer on the first and second doped regions and the alignment mark, forming an anti-reflection layer on a front surface field region, the front surface field region being one that is formed by the doping of the impurities of the second conductive type into the textured surface, forming contact holes exposing a portion of each of the first doped region and the second doped region using the alignment mark, and forming a first electrode and a second electrode electrically connected to the first doped region and the second doped region through the contact holes, respectively.

In the removing of the first doped layer, a surface of the semiconductor substrate in a formation area of the alignment mark may have an etched surface that is different from the textured surface in at least one of structure and property. For example, the textured surface has an anisotropically etched surface, and the surface of the semiconductor substrate at the formation area of the alignment mark has a non-uniformly or isotropically etched surface.

According to the above-described characteristics, because a process for forming the alignment mark is performed simultaneously with a process for forming the textured surface and a process for removing the first doped layer in a second doped region formation area, the alignment mark is formed without a separate process unlike the related art. Hence, the number of processes for forming the solar cells according to the example embodiment of the invention may be reduced compared with the related art.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 1:
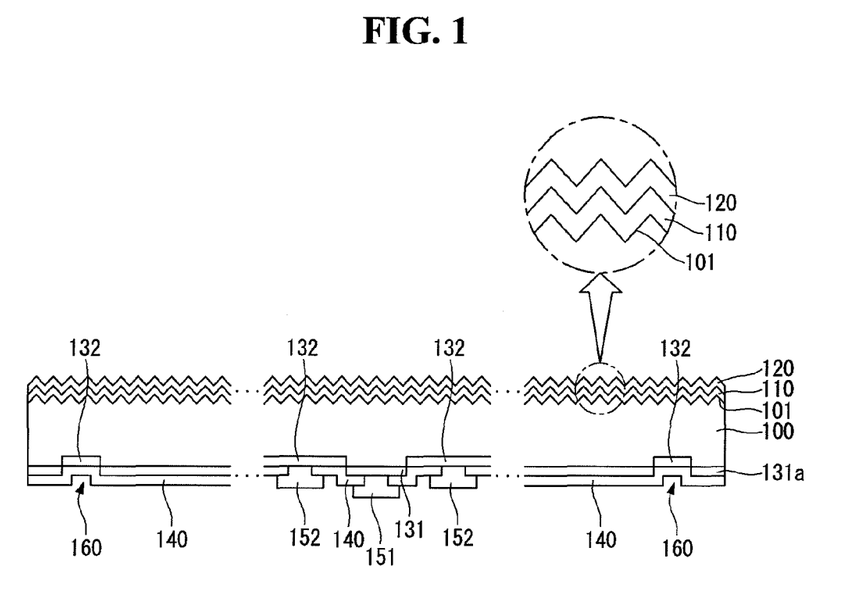
FIG. 1 is a partial cross-sectional view of a solar cell according to an example embodiment of the invention.

FIG. 1 is a partial cross-sectional view of a solar cell according to an example embodiment of the invention.

As shown in FIG. 1, a solar cell according to an example embodiment of the invention includes a semiconductor substrate 100 of a first conductive type, a front surface field region 110 formed in a front surface (for example, a light receiving surface) of the semiconductor substrate 100, an anti-reflection layer 120 formed on the front surface field region 110, a first doped region 131 that is formed in a back surface of the semiconductor substrate 100 and is heavily doped with impurities of the first conductive type, a second doped region 132 that is formed in the back surface of the semiconductor substrate 100 at a location adjacent to the first doped region 131 and is heavily doped with impurities of a second conductive type opposite the first conductive type, a back passivation layer 140 having a contact hole 141 (refer to FIG. 2J) exposing a portion of each of the first doped region 131 and the second doped region 132, an electron electrode 151 (hereinafter referred to as "a first electrode") electrically connected to the first doped region 131 exposed through the contact hole of the back passivation layer 140, and a hole electrode 152 (hereinafter referred to as "a second electrode") electrically connected to the second doped region 132 exposed through the contact hole 141 of the back passivation layer 140. Further, the solar cell according to the example embodiment of the invention further includes at least two alignment marks 160 formed in the back surface of the semiconductor substrate 100.

The light receiving surface of the semiconductor substrate 100 is textured to form a textured surface 101 corresponding to an uneven surface having a plurality of uneven portions. Thus, each of the front surface field region 110 and the anti-reflection layer 120 has a textured surface.

The semiconductor substrate 100 is formed of single crystal silicon of the first conductive type (for example, n-type), though not required. Alternatively, the semiconductor substrate 100 may be of a p-type and may be formed of polycrystalline silicon. Further, the semiconductor substrate 100 may be formed of other semiconductor materials other than silicon.

Because the light receiving surface of the semiconductor substrate 100 is the textured surface 101, an absorptance of light increases. Hence, the efficiency of the solar cell is improved.

The front surface field region 110 formed at the textured surface 101 of the semiconductor substrate 100, and is a region that is more heavily doped with impurities of a group V element such as phosphorus (P), arsenic (As), and antimony (Sb) than the semiconductor substrate 100. Thus, the front surface field region 110 prevents or reduces electrons and holes separated by light incident on the light receiving surface of the semiconductor substrate 100 from being recombined and/or from disappearing at the light receiving surface of the semiconductor substrate 100.

The anti-reflection layer 120 on the surface of the front surface field region 110 is formed of silicon nitride (SiNx), silicon dioxide (SiO$_2$), or titanium dioxide (TiO$_2$). The anti-reflection layer 120 reduces a reflectance of incident light and increases a selectivity of a predetermined wavelength band, thereby increasing the efficiency of the solar cell.

The first doped region 131 is a p-type heavily doped region, and the second doped region 132 is a region that is more heavily doped with n-type impurities than the semiconductor substrate 100. Thus, the p-type first doped region 131 and the n-type semiconductor substrate 100 form a p-n junction. The first doped region 131 and the second doped region 132 serve as a moving path of carriers (electrons and holes). The first doped region 131 and the second doped region 132 may be formed so as not to be coplanar.

The back passivation layer 140 having the contact hole 141 (refer to FIG. 2J) exposing the portion of each of the first doped region 131 and the second doped region 132 is formed of silicon nitride (SiNx), silicon dioxide (SiO$_2$), titanium dioxide (TiO$_2$), or a combination thereof. The back passivation layer 140 prevents or reduces a recombination and/or a disappearance of electrons and holes separated from carriers and reflects incident light to the inside of the solar cell so that the incident light is not reflected to the outside of the solar cell. Namely, the back passivation layer 140 prevents a loss of the incident light and reduces a loss amount of the incident light. The back passivation layer 140 may have a single-layered structure or a multi-layered structure such as a double-layered structure or a triple-layered structure. The back passivation layer 140 may have a step so that a portion (first portion) of the back passivation layer 140 is formed on the first doped region 131 and a portion (second portion) of the back passivation layer 140 is formed on the second doped region 132. Accordingly, the first and second portions of the back passivation layer 140 may be formed so as not to be coplanar.

The first electrode 151 is formed on the exposed portion of the first doped region 131 exposed by the contact hole 141 and on a portion of the back passivation layer 140 adjacent to the exposed portion of the first doped region 131. The second electrode 152 is formed on the exposed portion of the second doped region 132 exposed by the contact hole 141 and on a portion of the back passivation layer 140 adjacent to the exposed portion of the second doped region 132. Thus, the first electrode 151 is electrically connected to the first doped region 131, and the second electrode 152 is electrically connected to the second doped region 132. The first and second electrodes 151 and 152 are spaced apart from each other at a constant distance and extend parallel to each other in one direction. The first and second electrodes 151 and 152 may be formed so as not to be coplanar.

Because a portion of each of the first and second electrodes 151 and 152 overlaps a portion of the back passivation layer 140 and is connected to a bus bar area, a contact resistance and a series resistance generated when the first and second electrodes 151 and 152 contact an external driving circuit, etc., are reduced. Hence, the efficiency of the solar cell may be improved.

An alignment mark 160 used to align the contact hole 141 and the first and second electrodes 151 and 152 is formed on the back surface of the semiconductor substrate 100 on which the first and second doped regions 131 and 132 are formed. The alignment mark 160 is formed by etching the semiconductor substrate 100. It is preferable, but not required, that at least two alignment marks are used so as to accurately perform an alignment operation. Various shapes and various formation locations may be used for the alignment mark 160.

Processes in a method for manufacturing the solar cell according to the example embodiment of the invention is described below with reference to FIGS. 2A to 2J.

FIGS. 2A to 2J sequentially illustrate processes in a method for manufacturing a solar cell according to an example embodiment of the invention.

Figure 2A:
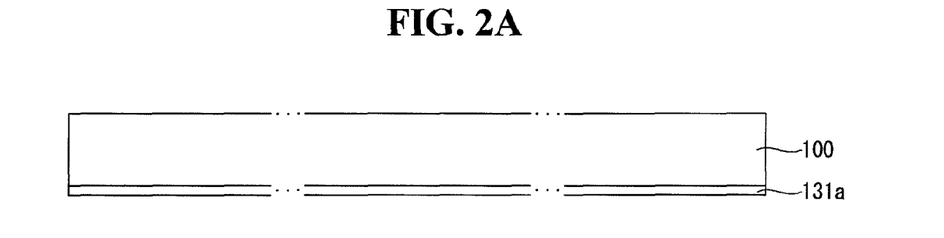
FIGS. 2A to 2J sequentially illustrate processes in a method for manufacturing a solar cell according to an example embodiment of the invention.

As shown in FIG. 2A, first, the back surface of the semiconductor substrate 100 is doped with p-type impurities (for example, boron (B), gallium (Ga), indium (In), etc.) to form a first doped layer 131a. When the first doped layer 131a is formed, a BSG layer (not shown) is formed on the surface of the first doped layer 131a.

Before the first doped layer 131a is formed at the back surface of the semiconductor substrate 100, a saw damage removal process and a cleansing process may be performed on the semiconductor substrate 100 to improve a surface state of the semiconductor substrate 100. Since the saw damage removal process and the cleansing process are well known to those skilled in the art, descriptions thereof are omitted.

Figure 2B:
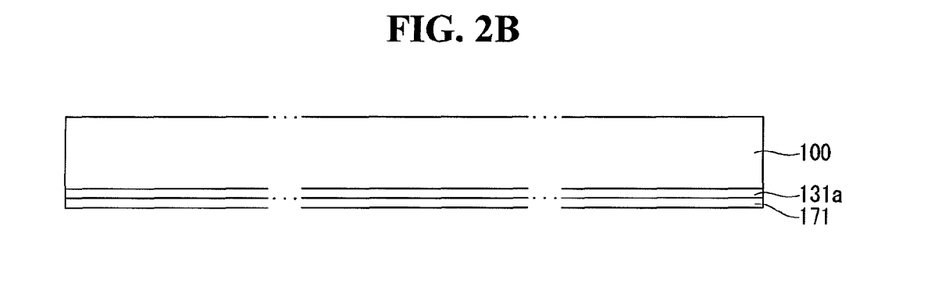

Next, as shown in FIG. 2B, an oxide layer such as a silicon dioxide (SiO$_2$) layer is grown at a high temperature to form an insulating layer 171. The process for forming the insulating layer 171 may be performed at about 1,000° C.

The insulating layer 171 may be formed using silicon nitride (SiNx). The insulating layer 171 may be formed using an organic insulating material as well as an inorganic insulating material such as silicon nitride (SiNx) and silicon dioxide (SiO$_2$). The insulating layer 171 may be formed using a chemical vapor deposition (CVD) method such as a plasma enhanced CVD (PECVD) method.

Figure 2C:
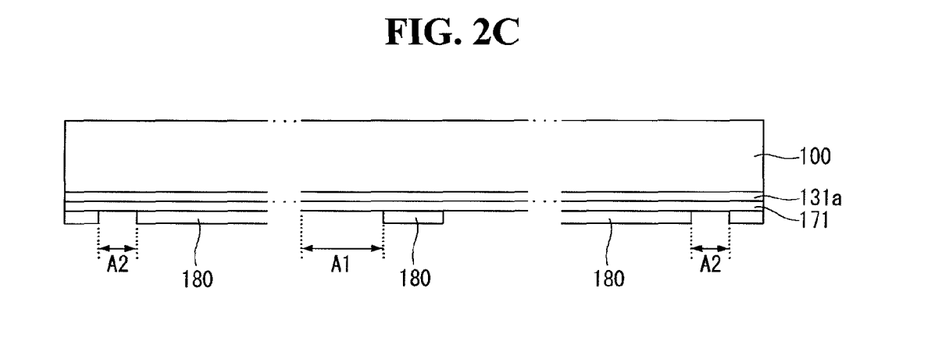

Next, as shown in FIG. 2C, a first mask 180 defining a second doped region formation area A1 and an alignment mark formation area A2 is formed on the insulating layer 171. The formation of the first mask 180 defining the second doped region formation area A1 and the alignment mark formation area A2 indicates that the second doped region formation area A1 and the alignment mark formation area A2 are opened so that the first doped layer 131a formed in both the second doped region formation area A1 and the alignment mark formation area A2 can be removed in a subsequent etching process.

The first mask 180 having the above-described structure may be firmed by applying and curing a photosensitive layer on the insulating layer 171 and then patterning the photosensitive layer using a photolithographic process.

Figure 2D:
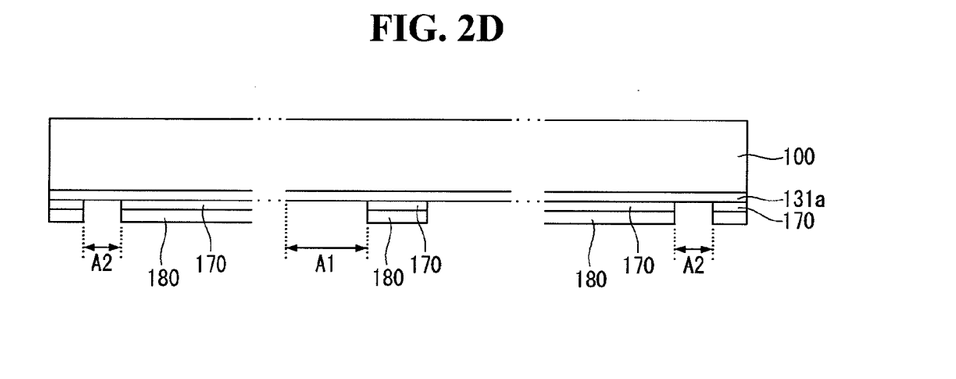

Next, as shown in FIG. 2D, an etching process is performed using the first mask 180 to selectively remove the insulating layer 171. In this case, the BSG layer (not shown) formed on the surface of the first doped layer 131a is removed. A hydrofluoric acid-based etchant may be used to remove the insulating layer 171. A second mask 170 having the same pattern as the first mask 180 is formed by selectively removing the insulating layer 171.

Figure 2E:
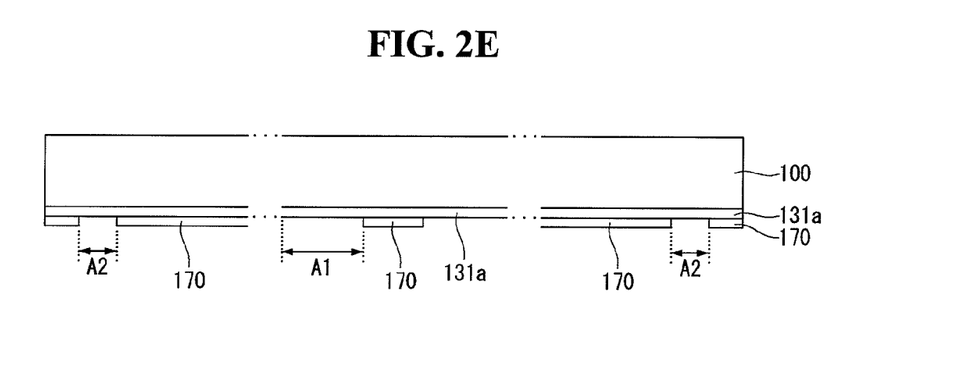
Figure 2F:
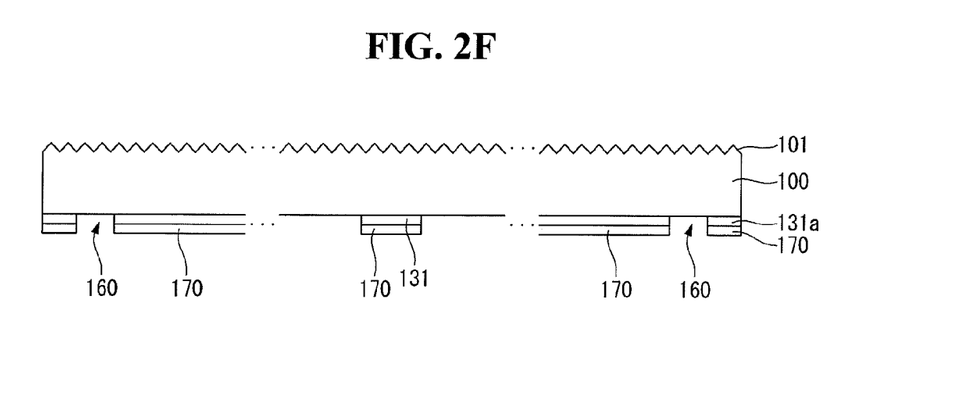

Next, as shown in FIG. 2E, the first mask 180 is removed. Subsequently, as shown in FIG. 2F, an etching process is performed using the second mask 170.

The etching process using the second mask 170 removes the first doped layer 131a formed in the second doped region formation area A1 and the alignment mark formation area A2, and at the same time, textures the light receiving surface of the semiconductor substrate 100 to form the textured surface 101.

A texturing process is generally performed by immersing the semiconductor substrate 100 in a bath filled with an alkali solution for a predetermined time.

For example, the texturing process may be performed by immersing the semiconductor substrate 100 in the alkali solution of about 80° C. for about 20 to 40 minutes. As the texturing process is performed, a portion protected by the second mask 170 is not etched, and a portion (for example, the second doped region formation area A1, the alignment mark formation area A2, and the light receiving surface of the semiconductor substrate 100) not protected by the second mask 170 is etched.

Examples of the alkali solution include KOH solution of about 2 wt % to 5 wt % and NaOH solution of about 2 wt % to 5 wt %.

Because an etch rate of the semiconductor substrate 100 varies depending on a crystal orientation of the semiconductor substrate 100, the textured surface is formed on the surface of the semiconductor substrate 100 through the texturing process.

As described above, the first doped layer 131a is formed on the semiconductor substrate 100 in the second doped region formation area A1 and the alignment mark formation area A2.

Because the light receiving surface of the semiconductor substrate 100 is not a region doped with impurities, the light receiving surface of the semiconductor substrate 100 is anisotropically etched at a very high etch rate during the texturing process. Thus, the textured surface 101 having an anisotropic structure having a uniform shape, for example, a pyramid shape is formed on the light receiving surface of the semiconductor substrate 100. For example, the anisotropic structure may have unequal property along different axes thereof.

However, because the alignment mark formation area A2 is the p-type doped region, the alignment mark formation area A2 is etched at an etch rate slower than the textured surface 101 without a specific orientation. Thus, the surface of the semiconductor substrate 100 in the alignment mark formation area A2 has an isotropic structure or a non-uniform structure unlike the textured surface 101. For example, the isotropic structure may have equal property along all axes thereof.

Further, because the first doped layer 131a formed on the semiconductor substrate 100 in the second doped region formation area A1 and the alignment mark formation area A2 is removed during the texturing process, the first doped region 131 and the alignment mark 160 are formed on the semiconductor substrate 100. The alignment mark 160 is formed by the etching of the first doped layer 131a of the semiconductor substrate 100 in addition to a height difference of the surface of the semiconductor substrate 100 generated by the removal of the BSG layer.

In the example embodiment of the invention, because the process for forming the alignment mark 160 is performed simultaneously with the process for forming the textured surface 101 and the process for removing the first doped layer 131a in the second doped region formation area A1, the alignment mark 160 is formed without a separate process unlike the related art. Hence, the number of processes for forming the solar cells according to the example embodiment of the invention may be reduced compared with the related art.

Figure 2G:
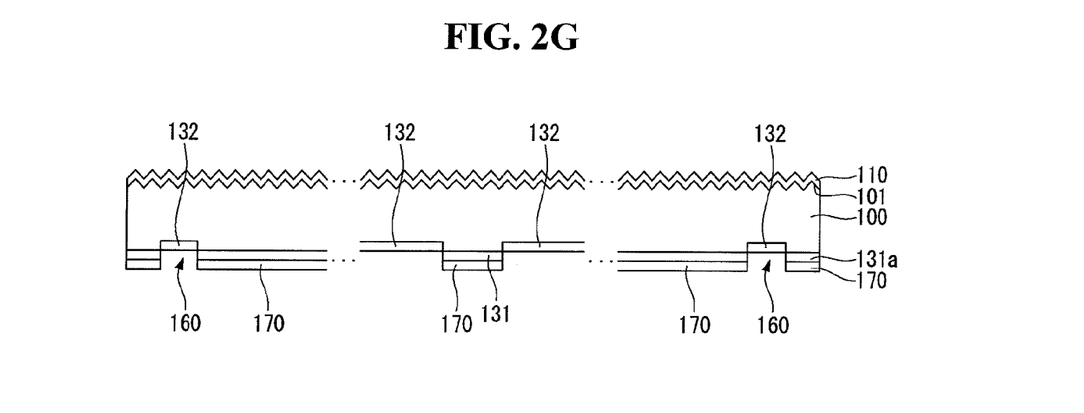
Figure 2H:
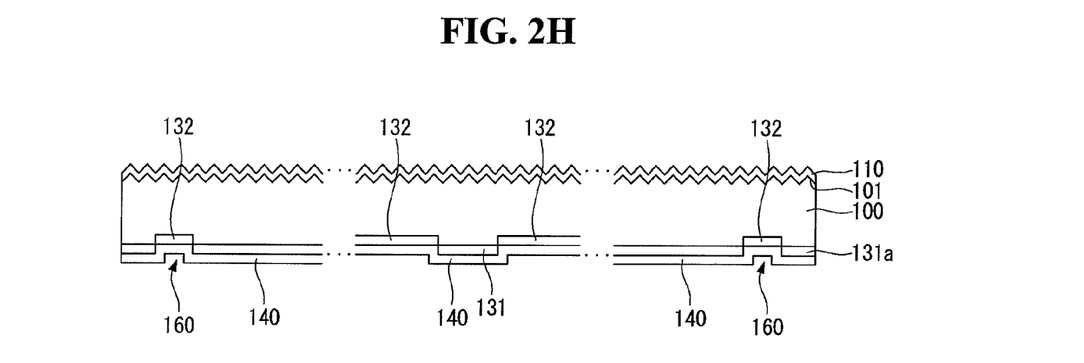

Next, as shown in FIGS. 2G and 2H, a portion not protected by the second mask 170, i.e., the semiconductor substrate 100 in the second doped region formation area A1 and the alignment mark formation area A2 and the textured surface 101 are doped with impurities of the second conductive type, i.e., n-type impurities (for example, a group V element such as phosphorus (P), arsenic (As), and antimony (Sb)).

When the textured surface 101 are doped with the impurities of the second conductive type, the front surface field region 110 is formed in the textured surface 101. The front surface field region 110 performs an operation similar to a back surface field region and thus prevents or reduces electrons and holes separated by incident light from being recombined and/or disappeared on the light receiving surface of the semiconductor substrate 100.

Subsequently, the second mask 170 is removed, and the back passivation layer 140 is formed on the entire back surface of the semiconductor substrate 100.

More specifically, the back passivation layer 140 may be formed by growing an oxide layer such as a silicon dioxide ($SiO_2$) layer at a high temperature. When it is difficult to obtain the back passivation layer 140 having a desired thickness through a high temperature growth or a degradation of the characteristics of the solar cell is generated because the oxide layer is grown at the high temperature for a long time, a silicon dioxide ($SiO_2$) layer may be additionally deposited using the CVD method such as the PECVD method.

The back passivation layer 140 may be formed using silicon nitride (SiNx). The back passivation layer 140 may be formed using an organic insulating material as well as an inorganic insulating material such as silicon nitride (SiNx) and silicon dioxide ($SiO_2$).

The back passivation layer 140 is formed along the height difference of the surface of the semiconductor substrate 100. Thus, the alignment mark 160 may be continuously confirmed.

Figure 2I:
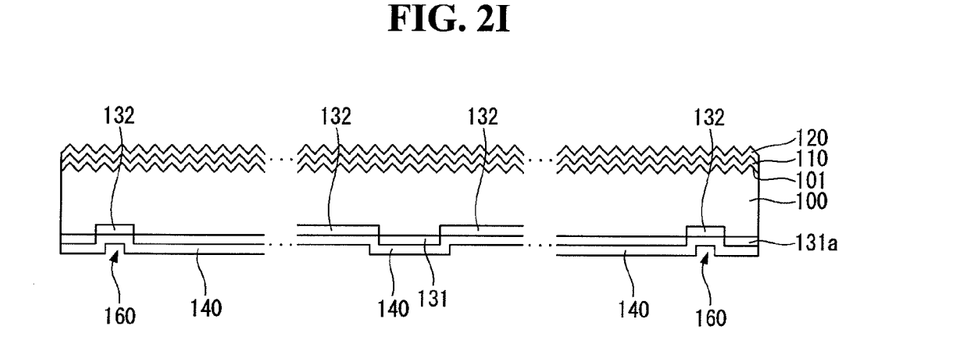

Next, as shown in FIG. 2I, the anti-reflection layer 120 is formed on the front surface of the front surface field region 110. The anti-reflection layer 120 may be generally formed of silicon nitride (SiNx), silicon dioxide ($SiO_2$) layer, or titanium dioxide ($TiO_2$), or a combination thereof using the CVD method such as the PECVD method or a sputtering method. The anti-reflection layer 120 may have two layers each having different physical properties. In this case, a lower layer of the two layers may be formed of a material having a high refractive index of about 2.2 to 2.6, and an upper layer may be formed of a material having a low refractive index of about 1.3 to 1.6.

Figure 2J:
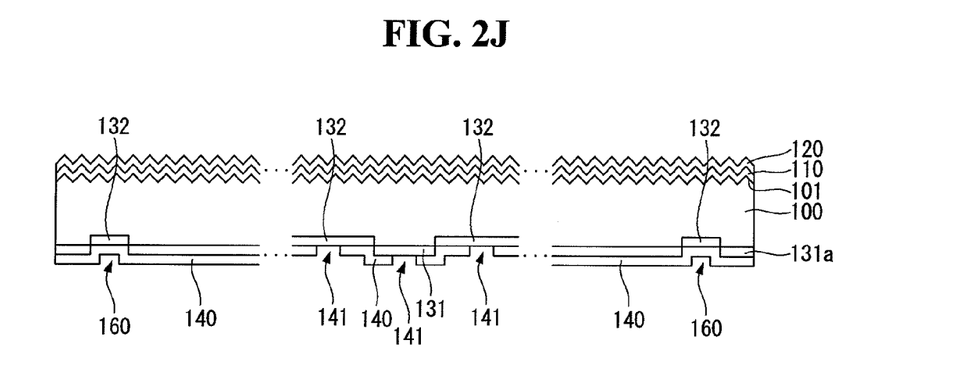

Next, as shown in FIG. 2J, the contact hole 141 is formed in the back passivation layer 140. A process for forming the contact hole 141 is performed after performing the alignment operation using the alignment mark 160.

The process for forming the contact hole 141 may be performed using an etching paste. The etching paste is formed on the back passivation layer 140 in a region exposing the first and second doped regions 131 and 132. The etching paste may include an etchant such as phosphoric acid and hydrofluoric acid. In this case, it is preferable, though not required, that the process for forming the etching paste is performed after performing the alignment operation using the alignment mark 160.

After the etching paste is formed, a thermal process is performed at a proper temperature and time to selectively etch the portion of the back passivation layer 140 where the etching paste is formed. Hence, the contact hole 141 exposing the portion of each of the first and second doped regions 131 and 132 is formed.

Subsequently, the remaining etching paste is removed using water. When the remaining etching paste is not completely removed, the remaining etching paste may be additionally removed using ultrasonic waves.

The process for forming the contact hole 141 may be performed using an etch resist.

After the contact hole 141 is formed, the first and second electrodes 151 and 152 are formed as shown in FIG. 1. Hence, the solar cell shown in FIG. 1 is completed. Each of the first and second electrodes 151 and 152 may be formed of a multi-layered conductive material and may be formed after performing the alignment operation using the alignment mark 160.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
    a semiconductor substrate;
    a first doped region of a first conductive type formed at a back surface of the semiconductor substrate;
    a second doped region formed at the back surface of the semiconductor substrate at a location adjacent to the first doped region, the second doped region being of a second conductive type opposite the first conductive type;
    a back passivation layer on the semiconductor substrate, the back passivation layer having contact holes exposing a portion of each of the first doped region and the second doped region;
    a first electrode formed on the first doped region exposed through the contact holes of the back passivation layer;
    a second electrode formed on the second doped region exposed through the contact holes of the back passivation layer;
    an alignment mark formed at the back surface of the semiconductor substrate;
    a third doped region formed on the semiconductor substrate at a formation region of the alignment mark; and
    a textured surface that is formed at a light receiving surface of the semiconductor substrate opposite the back surface of the semiconductor substrate in which the first and second doped regions are formed,
    wherein a surface of the semiconductor substrate at the formation region of the alignment mark has an etched surface that is different from the textured surface in at least one of structure and property,
    wherein the third doped region does not electrically contact the first and second electrodes, and
    wherein a surface of the third doped region is completely covered with the back passivation layer.

2. The solar cell of claim 1, wherein the textured surface has an anisotropically etched surface, and the surface of the semiconductor substrate at the formation region of the alignment mark has a non-uniformly or isotropically etched surface.

3. The solar cell of claim 1, wherein a front surface field region is positioned on the textured surface.

4. The solar cell of claim 3, wherein an anti-reflection layer is positioned on the front surface field region.

5. The solar cell of claim 1, wherein the back passivation layer is further formed on the semiconductor substrate at the formation region of the alignment mark and the back passivation layer is formed along a height difference of the back surface of the semiconductor substrate at the formation region of the alignment mark.

6. The solar cell of claim 1, wherein the third doped region and the second doped region are spaced apart from each other.

7. The solar cell of claim 1, wherein the third doped region has the same conductive type as the second doped region.

* * * * *